(12) United States Patent
Iacovangelo et al.

(10) Patent No.: US 6,890,656 B2
(45) Date of Patent: May 10, 2005

(54) HIGH RATE DEPOSITION OF TITANIUM DIOXIDE

(75) Inventors: Charles Iacovangelo, Clifton Park, NY (US); Gregory Ronald Gillette, Clifton Park, NY (US); Marc Schaepkens, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 32 days.

(21) Appl. No.: 10/248,152

(22) Filed: Dec. 20, 2002

(65) Prior Publication Data

US 2004/0121164 A1 Jun. 24, 2004

(51) Int. Cl.$^7$ .......................... B32B 27/36; B32B 9/00
(52) U.S. Cl. .................... 428/412; 428/689; 428/701; 428/702; 428/220
(58) Field of Search ............................... 428/412, 426, 428/432, 428, 689, 699, 701, 702, 220

(56) References Cited

U.S. PATENT DOCUMENTS

| | | |
|---|---|---|
| 3,161,615 A | 12/1964 | Goldberg |
| 3,220,973 A | 11/1965 | Goldberg |
| 3,312,659 A | 4/1967 | Kurkjy et al. |
| 3,312,660 A | 4/1967 | Kurkjy et al. |
| 3,313,777 A | 4/1967 | Elam et al. |
| 3,666,614 A | 5/1972 | Snedeker et al. |
| 3,989,672 A | 11/1976 | Bestergaard |
| 4,194,038 A | 3/1980 | Baker |
| 4,200,681 A | 4/1980 | Hall |
| 4,210,699 A | 7/1980 | Schroeter |
| 4,454,275 A | 6/1984 | Rosenquist |
| 4,842,941 A | 6/1989 | Devins et al. |
| 5,463,013 A | 10/1995 | Tokuda et al. |
| 5,510,448 A | 4/1996 | Fontane |
| 6,110,544 A * | 8/2000 | Yang et al. .................. 427/580 |
| 6,261,694 B1 | 7/2001 | Iacovangelo |
| 6,365,016 B1 | 4/2002 | Iacovangelo et al. |
| 6,379,757 B1 | 4/2002 | Iacovangelo |
| 6,397,776 B1 | 6/2002 | Yang et al. |
| 6,420,032 B1 | 7/2002 | Iacovangelo |
| 6,426,125 B1 | 7/2002 | Yang et al. |
| 6,517,687 B1 | 2/2003 | Iacovangelo |

FOREIGN PATENT DOCUMENTS

| | | |
|---|---|---|
| EP | 0 887 437 | 12/1998 |
| EP | 1365 458 | 11/2003 |
| WO | WO 99/20809 | 4/1999 |

OTHER PUBLICATIONS

PCT Search Report dated Jun. 8, 2004.
Seung–Min Oh et al., "Production of Ultrafine Titanium Dioxide By DC Plasma Jet", Thin Solid Films, Elsevier, vol. 386, pp. 233–238, 2001.

* cited by examiner

Primary Examiner—Deborah Jones
Assistant Examiner—G. Blackwell-Rudasill
(74) Attorney, Agent, or Firm—Foley & Lardner LLP

(57) ABSTRACT

There is provided a structure. The structure comprises a substrate, and a titanium oxide layer disposed over the substrate. There is also provided a method of forming a titanium oxide coating on a substrate. The method includes generating a plasma; providing a first reactant, comprising titanium, and a second reactant, comprising oxygen, into the plasma stream extending to the substrate; and forming the titanium oxide coating on the substrate.

19 Claims, 2 Drawing Sheets

HIGH RATE DEPOSITION OF TITANIUM DIOXIDE

BACKGROUND OF THE INVENTION

This invention is related generally to $TiO_x$ (titanium oxide) or titanium oxide $TiO_2$ (titanium dioxide) coatings or films, products incorporating the $TiO_x$ coatings, methods for making the coatings and products, and an apparatus for making the coatings and products.

$TiO_2$ is widely used in a number of applications. For example, $TiO_2$ is used for UV filters in glazing and opthalmic applications, as a high index material in optical stacks, and as a photocatalytic coating to degrade organics on the surface of billboards and lighting fixtures. $TiO_2$ is typically deposited at high temperatures by chemical vapor deposition (CVD) techniques. These CVD techniques, however, can not be used on low temperature substrates such as plastics or polymers, because the deposition temperatures will damage the substrate.

$TiO_2$ has been deposited on low temperature substrates, such as some plastics, by conventional physical vapor deposition (PVD) techniques such as sputtering and e-beam evaporation. These PVD techniques, however, suffer from being very low rate processes, typically, 10–100 angstroms/minute. In addition, the $TiO_2$ coatings tend to have a high tensile stress, thus limiting their usefulness in applications requiring thicker deposits, multi-layer stacks, and depositing on thin films where the stress may cause curling of the substrate. Also, these coatings tend to be rough with low absorbency per unit thickness (A/t) in the UV light range, where A is the absorbency and t is the thickness.

More recently, workers have tried to overcome the problems cited above by depositing $TiO_2$ in plasma enhanced chemical vapor deposition (PECVD) reactors with and without biasing. These PECVD processes, however, have not overcome the limitations of the classical PVD approaches, and still generate low rate, highly stressed $TiO_2$ coatings with low (A/t) in the UV light range.

SUMMARY OF THE INVENTION

In accordance with one aspect of the present invention, there is provided a structure comprising a substrate; and a titanium oxide layer disposed over the substrate, wherein the titanium oxide layer is characterized by a property, wherein the property is at least one of an absorbency per unit thickness at an optical wavelength of 330 nm of greater than $4/\mu m$, an absorbency per unit thickness at an optical wavelength of 330 nm of greater than $4/\mu m$ which decreases by no more than 5% after the structure is submerged for 3 days in distilled water at 65° C., and a haze increase of less than 1% after the structure is submerged for 3 days in distilled water at 65° C.

In accordance with another aspect of the present invention, there is provided a method of forming a titanium oxide coating on a substrate, the method comprising: generating a plasma stream with an expanding thermal plasma generator; providing a first reactant, comprising titanium, and a second reactant, comprising oxygen, into the plasma stream extending to the substrate; and forming the titanium oxide coating on the substrate.

In accordance with another aspect of the present invention, there is provided an apparatus for forming a titanium oxide film comprising: a first reactant source containing $TiCl_4$; a second reactant source containing water vapor; a plasma stream generator; and a substrate holder.

DETAILED DESCRIPTION OF THE PREFERRED EMBODIMENTS

The present inventors have realized that an expanding thermal plasma (ETP) process can deposit $TiO_2$ at low temperatures while maintaining high deposition rates and still provide high quality coatings with properties such as good clarity, refractive index, UV absorbency, gas/moisture barrier and hydrolytic stability.

Structure with $TiO_2$ Coating

Figure 1:
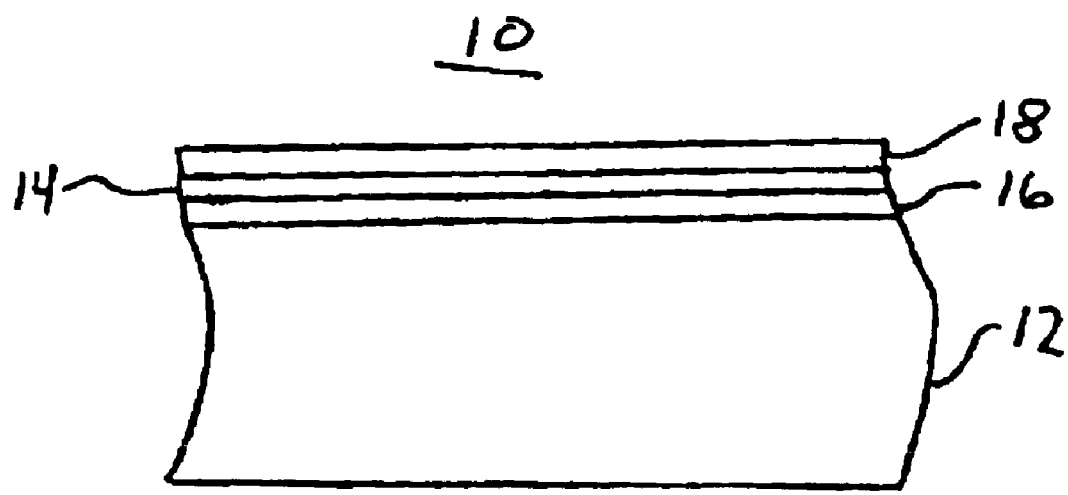
FIG. 1 is a side cross sectional view of a substrate coated with a $TiO_2$ layer according to an exemplary embodiment of the invention.

FIG. 1 illustrates a structure 10 incorporating an improved $TiO_x$ coating according to one embodiment of the invention. The $TiO_x$ coating may comprise a stoichiometric $TiO_2$ coating or a non-stoichiometric $TiO_x$ coating where x is not equal to 2. The structure includes a substrate 12 and a $TiO_x$ layer 14 disposed over the substrate. The structure 10 may optionally include an interlayer 16 disposed between the substrate 12 and the $TiO_x$ layer 14 depending upon the application. The interlayer 16 may function as an adhesion layer between the substrate 12 and the $TiO_x$ layer 14 to promote adhesion between these layers, or may function to reduce stress between the substrate 12 and overlying layers, including the $TiO_x$ layer 14. The interlayer 16 may comprise sublayers where one sublayer functions to reduce stress between the substrate 12 and the $TiO_x$ layer 14, and the other sublayer functions to promote adhesion between the substrate 12 and the $TiO_x$ layer 14. Alternatively, the interlayer 16 may provide both the functions of an adhesion layer and to reduce stress. The structure 10 may also optionally include an abrasion resistant layer 18 on the $TiO_x$ layer 14 to protect the $TiO_x$ layer 14 from abrasion. The structure may optionally incorporate IR reflecting or electrically conducting layers between the $TiO_2$ layer 14 and the abrasion layers (if any). The structure 10 may optionally contain antireflecting layers on top of layer 18. Alternatively, the structure of a stress release/reduction layer and a $TiO_x$ layer 14 may be repeated a number of times to form a multi-layer stack that has superior barrier performance over single layer $TiO_x$ barrier coatings.

The substrate 10 may be a low temperature substrate. In this application low temperature substrate means a substrate that may be damaged at temperatures slightly greater than about 150° C. The substrate 10 may alternatively be a high temperature substrate. In this application high temperature substrate means a substrate that is not expected to be damaged at temperatures slightly greater than about 250° C.

The substrate may comprise for example, a polymer resin. For example, the substrate may comprise a polycarbonate. Polycarbonates suitable for forming the substrate are well-known in the art.

Aromatic carbonate polymers may be prepared by methods well known in the art as described, for example, in U.S. Pat. Nos. 3,161,615; 3,220,973; 3,312,659; 3,312,660; 3,313,777; 3,666,614; 3,989,672; 4,200,681; 4,842,941; and 4,210,699, all of which are incorporated herein by reference.

The substrate may also comprise a polyestercarbonate which can be prepared by reacting a carbonate precursor, a dihydric phenol, and a dicarboxylic acid or ester forming derivative thereof. Polyestercarbonates are described, for example, in U.S. Pat. Nos. 4,454,275; 5,510,448; 4,194,038; and 5,463,013, all of which are incorporated herein by reference.

The substrate may also comprise a thermoplastic or thermoset material. Examples of suitable thermoplastic materials include polyethylene, polypropylene, polystyrene, polyvinylacetate, polyvinylalcohol, polyvinylacetal, polymethacrylate ester, polyacrylic acids, polyether, polyester, polycarbonate, cellulous resin, polyacrylonitrile, polyamide, polyimide, polyvinylchloride, fluorine containing resins and polysulfone. Examples of suitable thermoset materials include epoxy and urea melamine.

Acrylic polymers, also well known in the art, are another material from which the substrate may be formed. Acrylic polymers can be prepared from monomers such as methyl acrylate, acrylic acid, methacrylic acid, methyl methacrylate, butyl methacrylate, cyclohexyl methacrylate, and the like. Substituted acrylates and methacrylates, such as hydroxyethyl acrylate, hydroxybutyl acrylate, 2-ethylhexylacrylate, and n-butylacrylate may also be used.

Polyesters can also be used to form the substrate. Polyesters are well-known in the art, and may be prepared by the polyesterification of organic polycarboxylic acids (e.g., phthalic acid, hexahydrophthalic acid, adipic acid, maleic acid, terphthalic acid, isophthalic acid, sebacic acid, dodecanedioic acid, and the like) or their anhydrides with organic polyols containing primary or secondary hydroxyl groups (e.g., ethylene glycol, butylene glycol, neopentyl glycol, and cyclohexanedimethanol).

Polyurethanes are another class of materials which can be used to form the substrate. Polyurethanes are well-known in the art, and are prepared by the reaction of a polyisocyanate and a polyol. Examples of useful polyisocyanates include hexamethylene diisocyanate, toluene diisocyanate, MDI, isophorone diisocyanate, and biurets and triisocyanurates of these diisocyanates. Examples of useful polyols include low molecular weight aliphatic polyols, polyester polyols, polyether polyols, fatty alcohols, and the like.

Examples of other materials from which the substrate may be formed include acrylonitrile-butadiene-styrene, glass, VALOX® (polybutylenephthalate, available from General Electric Co.), XENOY® (a blend of LEXAN® and VALOX®, available from Ceneral Electric Co.), and the like. Typically, the substrate comprises a clear polymeric material, such as PC, PPC, PES, PEI or acrylic.

The substrate can be formed in a conventional manner, for example by injection molding, extrusion, cold forming, vacuum forming, blow molding, compression molding, transfer molding, thermal forming, solvent casting and the like. The article or product may be in any shape and need not be a finished article of commerce, that is, it may be sheet material or film which would be cut or sized or mechanically shaped into a finished article. The substrate may be transparent or not transparent. The substrate may be rigid or flexible.

The substrate may be, for example, a vehicle window, such as a car, truck, motorcycle, tractor, boat or air plane window. The substrate may also comprise an eye glass lens, an optical stack, a display screen or a component for a display screen, such as a television screen, LCD screen, computer monitor screen, a plasma display screen or a glare guard for a computer monitor.

The substrate is preferably a polymer substrate, which will typically be a low temperature substrate.

The $TiO_x$ layer 14 is preferably formed by an Expanding Thermal Plasma process (ETP), as discussed in more detail below. ETP processes, such as arc plasma deposition, and systems performing ETP, are generally known, and are described in U.S. Pat. No. 6,420,032, for example, which is herein incorporated by reference in its entirety. The TiOx layer 14 has UV absorption properties and is typically about 10 to 10,000 nm thick.

The interlayer 16 may function to relieve stress between the substrate 12 and the overlying layers. Stress may occur, for example, due to different coefficients of thermal expansion, different ductility, and different elastic moduli between the substrate 12 and the overlying layers. Preferably, the interlayer 16 comprises a material which has a value of coefficient of thermal expansion, ductility, and elastic modulus which is between the corresponding values of the substrate and the overlying layers. One example of a suitable interlayer material is a plasma polymerized organosilicon, as described in the application Ser. No. 09/271,654, entitled "Multilayer Article and Method of Making by Arc Plasma Deposition", which is incorporated by reference.

The abrasion resistant layer 18 prevents the $TiO_x$ layer 14 from being scratched during use. The abrasion resistant layer 18 may comprise any scratch or abrasion resistant and UV stable material. The abrasion resistant layer 18 may comprise, for example, a plasma polymerized organosilicon material, as described in U.S. Ser. No. 09/271,654. The organosilicon material may comprise, for example, octamethylcyclotetrasiloxane (D4), tetramethyidisiloxane (TMDSO), hexamethyidisiloxane (HMDSO), or other organosilicon, as described in the above application. The organosilicon monomers are oxidized, decomposed, and polymerized in an arc plasma deposition apparatus, to form an abrasion resistant layer which comprises an oxidized D4, TMDSO, or HMDSO layer, for example. Such an abrasion resistant layer may be referred to as a $SiO_x$ layer. However, the $SiO_x$ layer may also contain hydrogen and carbon atoms in which case it is generally referred to as $SiO_xC_yH_z$. Other examples of compounds and materials suitable as the abrasion-resistant material include silicon dioxide and aluminum oxide, for example.

Deposition System

Figure 2:
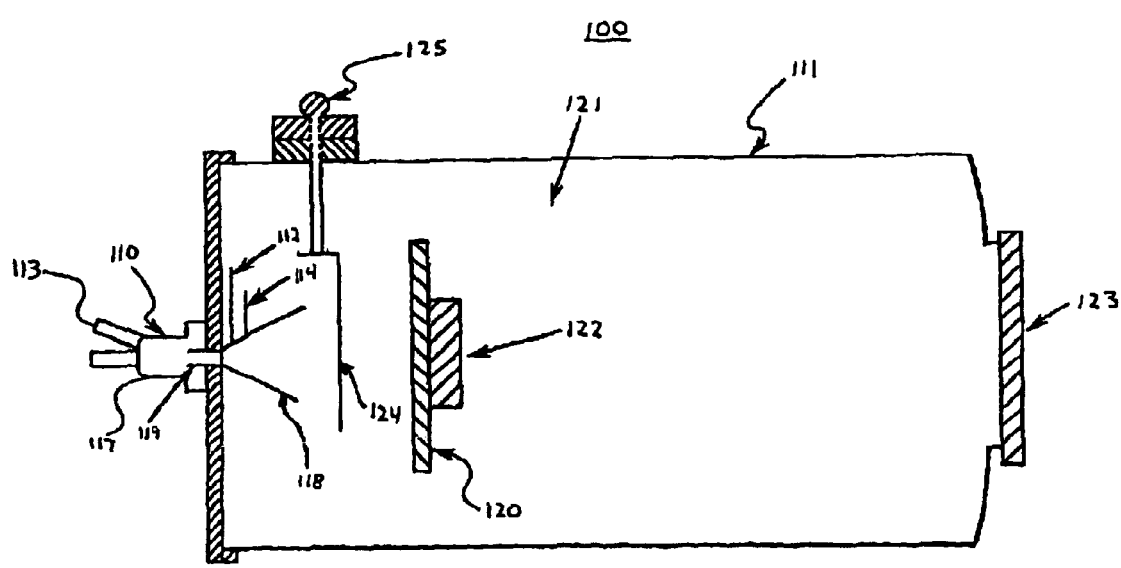
FIG. 2 is side cross sectional view of an apparatus used to manufacture the substrate coated with a $TiO_2$ layer according to an exemplary embodiment of the invention.

The system for forming the $TiO_x$ layer 14 is preferably an ETP system such as described in U.S. Pat. No. 6,420,032. FIG. 2 illustrates an example of an appropriate system 100 for forming a $TiO_x$ layer 14 according to embodiments of the invention. The system of FIG. 2 is similar to the system of FIG. 4 of U.S. Pat. No. 6,420,032. However, in FIG. 2, only two reactant supply lines are shown, although the system may have more than two reactant supply lines. Other appropriate ETP systems are disclosed for example in U.S. Pat. No. 6,397,776, entitled "APPARATUS FOR LARGE AREA CHEMICAL VAPOR DEPOSITION USING MULTIPLE EXPANDING THERMAL PLASMA GENERATORS", and U.S. Patent application Ser. Nos. 09/683,148, 09/683,149 and 10/064,888, all of which are hereby incorporated by reference in their entirety. These latter disclosures illustrate features such as multiple injection rings, one ring around several arcs, and/or an adjustable cathode to anode distance, which may be preferable in some applications.

The system 100 comprises a plasma generation chamber 110 and a deposition chamber 111. The deposition chamber 111 contains a substrate 120 mounted on a temperature controlled support 122. The substrate 120 may be a transparent glass or polymeric substrate, for example, coated with the interlayer 16, shown in FIG. 1. The deposition chamber 111 also contains a door (not shown) for loading and unloading the substrate 120 and an outlet 123 for connecting to a pump. The support 122 may be positioned at any position in volume 121 of deposition chamber 111. The substrate 120 may be positioned 10 to 50 cm, for example, and typically about 25.5 cm, from the anode 119 of the plasma generator.

The deposition chamber 111 also optionally comprises a retractable shutter 124. The shutter may be positioned, for example, by a handle 125 or by a computer controlled positioning mechanism. The shutter 124 may also contain a circular aperture to control the diameter of the plasma that emanates from the plasma generation chamber 110 towards the substrate 120. The deposition chamber 111 may also optionally comprise magnets or magnetic field generating coils (not shown) adjacent to chamber walls to direct the flow of the plasma.

The deposition chamber 111 may also contain an optional nozzle 118. The nozzle 118 provides improved control of the injection, ionization and reaction of the reactants to be deposited on the substrate 120. The nozzle 118 provides for the deposition of a material such as the TiO$_x$ layer on the substrate 120 and minimizes or even prevents formation of powdery reactant deposits on the substrate 120. Preferably, the nozzle 118, if employed, has a conical shape with a divergent angle of about 40 degrees and a length of about 10 to 80 cm, preferably about 16 cm. However, the nozzle 118 may alternatively have a variable cross section, such as such as conical-cylindrical-conical or conical-cylindrical. Furthermore, the nozzle 118 may have a divergent angle other than 40 degrees and a length other than 16 cm. The nozzle may also be omitted entirely.

The deposition chamber 111 also contains at least one reactant supply line. The number of reactant supply lines may be, for example, two or more. For example, the deposition chamber 111 may contain a first reactant supply line 112 and a second reactant supply line 114 to deposit the TiO$_x$ layer film on the substrate 120. The supply lines 112 and 114 preferably communicate with the nozzle 118 and supply reactants into the plasma flowing through the nozzle. The deposition chamber 111 also generally contains vacuum pumps (not shown) for evacuating the chamber 111.

The plasma generation chamber 110 contains at least one cathode 113, a plasma gas supply line 117 and an anode 119. The plasma generation chamber 110 typically comprises three cathodes 113. The cathodes 113 may comprise, for example, tungsten or thorium doped tungsten tips. The use of thorium allows the temperature of the tips to be maintained below the melting point of tungsten, thus avoiding contamination of the plasma with tungsten atoms.

The plasma generation chamber 110 generally includes at least one plasma gas supply line 117. The plasma generation chamber 110 may also contain a purging gas supply line adjacent to the carrier gas supply line 117 to supply a purging gas to chambers 110 and 111 prior to supplying the plasma gas.

To form a plasma in the plasma generation chamber 110, a plasma gas is supplied through plasma gas supply line 117. The plasma gas may suitably comprise a noble gas, such as argon or helium, or a reactive gas, such as nitrogen, ammonia, carbon dioxide or hydrogen or any mixture thereof. If there is more than one plasma gas, then the plural gasses may be supplied through plural supply lines, if desired. Preferably, for the TiO$_x$ deposition, the plasma gas comprises argon. The plasma gas in plasma generation chamber 110 is maintained at a higher pressure than the pressure in the deposition chamber 111, which is continuously evacuated by a pump. An arc voltage is then applied between the cathode(s) 113 and the anode 119 to generate a plasma in the plasma generation chamber 110. The plasma then extends through the aperture of the anode 119 into the deposition chamber 111 due to the pressure difference between chambers 110 and 111. The reactants are supplied into the plasma through supply lines 112 and 114.

Method of Forming the TiO$_x$ Coating

A method of forming a TiO$_x$ coating on a substrate according to an embodiment of the present invention is now described. The substrate may comprise, for example, a low temperature substrate of polycarbonate with an interlayer formed on the polycarbonate. The substrate is provided in the deposition chamber 111 of the system 100 of FIG. 2. A plasma is generated using a plasma gas supplied by plasma gas line 117. The plasma gas may be, for example, a noble gas. Preferably the plasma gas is Ar.

First and second reactants are then supplied to the plasma via supply lines. The first reactant comprises titanium and the second reactant comprises oxygen. Preferably the first reactant comprises TiCl$_4$ and the second reactant comprises water vapor. The first and second reactants react and form a TiO$_x$ film on the substrate.

For a first reactant comprising TiCl$_4$ and a second reactant comprising water, the preferred range of deposition would be between 10 and 1000 nm and more preferably between 200 and 600 nm, the preferred reactant flow rate ranges are 0.1 to 1 slm for TiCl$_4$ and 0.4 to 4 slm for water. The preferred power range is 20 to 3000 W dc power, 1 to 100 Amps, and 20–30 V. High quality TiO$_x$ films can be deposited at a rate greater than 1 $\mu$m per minute.

EXAMPLES

A polycarbonate substrate was provided as a substrate. A TiO$_x$ layer was formed directly on the polycarbonate. All depositions on the polycarbonate included a V-D4 layer deposited at 20 Amps, 1.65 lpm of Ar and 0.03 lpm V-D4 scanning past the Etp as 2.3 cm/second. The first reactant was TiCl 4. The second reactant was water vapor and Ar was used as the plasma gas. The chamber pressure was 45 mT (milliTorr). The deposition parameters are shown in Table 1. All of examples in Table 1 were for ETP deposition except for sample 6.

As another example, TiO$_x$ layers were formed using an Ar ETP with titanium isopropoxide as a first reactant and water vapor as a second reactant. The deposition conditions are shown in Table 1.

As yet another example, a TiO$_x$ layer was formed using an Ar ETP with titanium ethoxide or as a first reactant and water vapor as a second reactant. The deposition conditions are also shown in Table 1.

TABLE 1

| # | Source | Ar lpm | Ox lpm | H$_2$O lpm | Amp | Abs | Thick (nm) | Haze | A/t (/$\mu$m) | Change A WS (%) |
|---|--------|--------|--------|------------|-----|-----|------------|------|---------------|-----------------|
| 1 | TiCl$_4$ | 0.2 | 1.65 |  | 0.8 | 80 | 1.1 | 186 | 0.6 | 5.9 | 0 |
| 2 | isopr | 0.4 | 1.65 | 2.0 |  | 80 | 0.74 | 300 | 19 | 2.5 | 20 |

TABLE 1-continued

| # | Source | Ar lpm | Ox lpm | H$_2$O lpm | Amp | Abs | Thick (nm) | Haze | A/t (/μm) | Change A WS (%) |
|---|---|---|---|---|---|---|---|---|---|---|
| 3 | isopr | 0.3 | 2.0 | 6.0 |   | 70 | 0.30 | 80 | 0.5 | 3.76 | NA |
| 4 | isopr | 0.3 | 2 |   | 2.5 | 80 | 0.89 | 558 | 1.5 | 1.6 | 5 |
| 5 | ethoxide | 0.3 | 2 |   | 2.5 | 90 | 0.75 | 500 | 2.2 | 1.5 | NA |
| 6 | isopr* |   | * | * | * | * | 0.78 | 506 | 11 | 1.5 | delam |
| 7 | TiCl$_4$ | 0.6 | 5 |   | 2.4 | 90 | 1.65 | 319 | 0.8 | 5.2 | 0 |

The samples 1 through 7 were prepared at a chamber pressure of 45 mT, with a deposition time of ~7 seconds for samples other than sample 6. Sample 6 was a comparative PECVD run using N$_2$O at 100 sccm, TiPT at 5 sccm, for 14 minutes at 100 mT pressure and 200 W power. The PECVD film delaminated under a water soak treatment.

Table 1 lists the flow rates for the source gases TiCl$_4$, titanium isopropoxide and titanium ethoxide, and the flow rates of Argon (Ar), oxygen (Ox), water (H$_2$O). Table 1 also lists the current (Amp), absorbency (Abs), thickness (nm), haze, and absorbency per unit thickness (A/3t).

For the water soak treatment, the samples were immersed for 3 days at 65° C. in distilled water and examined for extent of delaminated areas and change in absorbency. The column labeled Change A WS (%) shows the percent change in absorbency at 330 nm after the water soak treatment. As can be seen in Table 1, only the films formed using the source gase TiCl$_4$ did not change absorbency under the water soak treatment.

The samples formed using isopropoxide were relatively hazy and of lower absorbency as compared to those formed using TiCl$_4$, unless the oxygen flow rate (for isopropoxide formed films) was substantially increased relative to the water flow rate (for TiCl$_4$ formed films). The absorbency and thickness was also better for the TiCl$_4$ formed films for the lower water flow rate. The properties for the TiCl$_4$ formed films was also improved relative to the ethoxide formed films as can be seen in Table 1.

Table 2 shows a number of samples of titanium oxide films formed using TiCl$_4$ where the titanium oxide film is part of a muitilayer film package, and where the multilayer package was subjected to a water soak treatment.

TABLE 2

| # | Temp | Ar lpm | H$_2$O lpm | Amp | Delaminate % area | Change A WS (%) |
|---|---|---|---|---|---|---|
| 8 | 75 | 1.65 | 1.8 | 80 | 30 | 60 |
| 9 | 100 | 1.65 | 1.8 | 80 | 35 | 40 |
| 10 | 120 | 1.65 | 1.8 | 80 | 35 | 5 |
| 11 | 130 | 1.65 | 1.8 | 80 | 30 | 0 |
| 12 | 120 | 2 | 1.8 | 80 | 10 | 2 |
| 13 | 120 | 3 | 1.8 | 80 | 5 | 0 |
| 14 | 120 | 3 | 0.8 | 80 | 0 | 0 |
| 15 | PECVD |   |   |   | 50% |   |

In Table 2 all samples were prepared as follows with the exceptions noted in the table. The polycarbonate substrate was cleaned in IPA, rinsed, and dried at 80° C. overnight. All deposition and etching was done at a pressure of 45 mT with an ETP under the following conditions. The sample was preheated to varying temperatures to achieve the deposition temperature (Temp) given in table 2. An interlayer was deposited at deposition parameters 20A, 1.65 lpm Ar, 0.03 lpm V-D4, This interlayer layer was etched ar 40A, 1.65 lpm Ar, 0.3 lpm oxygen. Titanium oxide was deposited at 80A, 0.2 lpm TiCl$_4$, with varying Ar and water. This titanium oxide layer was etched at 40A, 1.65 lpm Ar, 0.3 lpm oxygen. Then an abrasion layer comprising 5 abrasion layers were deposited at 70A, 1.65 lpm Ar, 0.19 lpm D4, with oxygen at 0.2, 0.4, 0.6, and 0.8 lpm in layers 1–5 respectively. The samples were immersed for 3 days at 65° C. in distilled water and examined for extent of delaminated areas and change in absorbency. Some of the samples exhibited multiple circular defects upon the water soak treatment which could be seen in scanning electron micrograph (SEM) analysis. As can be seen from table 2, the samples that were prepared at higher Ar flow rate showed the least delamination.

Further, the titanium oxide layer density of the films formed using TiCl$_4$ and water can be sufficiently high and porosity can be sufficiently low to significantly reduce the oxygen and moisture permeation rates through coated polycarbonate film substrate to less than 10 cc/m2/day at 100% O$_2$ at room temperature.

As can be seen from table 1 and 2, the titanium oxide films themselves (table 1) and the multilayer package incorporating the titanium oxide films both showed good delamination properties and little change in absorbency for the water soak treatment in the case that TiCl4 and water were used as reactant gases.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A structure comprising:
   a substrate; and
   a titanium oxide layer disposed over the substrate, wherein the titanium oxide layer is characterized by a property, wherein the property is at least one of an absorbency per unit thickness at an optical wavelength of 330 nm of greater than 4/μm, or an absorbency per unit thickness at an optical wavelength of 330 nm of greater than 4/μm which decreases by no more than 5% after the structure is submerged for 3 days in distilled water at 65° C.

2. The structure of claim 1, further comprising:
   an interlayer disposed between the substrate and the titanium oxide layer.

3. The structure of claim 1, further comprising:
   a stack of alternating interlayers and titanium oxide layers formed over the titanium oxide layer.

4. The structure of claim 1, further comprising:
   an abrasion resistant layer disposed on the titanium oxide layer.

5. The structure of claim 4, wherein the abrasion resistant layer is one of $SiO_x$, $SiO_x C_y H_z$, silicon dioxide and aluminum oxide.

6. The structure of claim 1, wherein the substrate comprises a polymer.

7. The structure of claim 6, wherein the substrate comprises polycarbonate.

8. The structure of claim 1, wherein the substrate comprises one of a lens, a vehicle window, a display screen and a component for a display screen.

9. The structure of claim 1, wherein the titanium oxide layer is deposited using an expanding thermal plasma technique.

10. The structure of claim 1, wherein the substrate is polycarbonate and the oxygen permeation rate through the polycarbonate film is less than 10 cc/m$^2$/day in 100% $O_2$ at room temperature.

11. The structure of claim 1, wherein the titanium oxide layer has an absorbency per unit thickness at an optical wavelength of 330 nm of greater than 4/$\mu$m.

12. The structure of claim 1, wherein the titanium oxide layer has an absorbency per unit thickness at an optical wavelength of 330 nm of greater than 4/$\mu$m which decreases by no more than 5% after the structure is submerged for 3 days in distilled water at 65° C.

13. The structure of claim 1, further comprising:

an interlayer disposed between the substrate and the titanium oxide layer; and an abrasion layer disposed on the titanium oxide layer; and wherein the structure exhibits no delamination after the structure is submerged for 3 days in distilled water at 65° C.

14. A method of forming the structure of claim 1, the method comprising:

generating a plasma stream with an expanding thermal plasma generator providing a first reactant, comprising titanium, and a second reactant, comprising oxygen, into the plasma stream extending to the substrate; and forming the titanium oxide layer.

15. The method of claim 14, wherein the titanium oxide coating is formed on the substrate at a rate of greater than 1 $\mu$m/minute.

16. The method of claim 14, wherein the first reactant comprises $TiCl_4$ and the second reactant comprises water vapor.

17. The method of claim 14, wherein the plasma stream comprises an Ar plasma stream.

18. The method of claim 14, wherein the deposition rate of the titanium oxide film is at least about 16 nm/second.

19. A titanium oxide coating made by the method of claim 14.

* * * * *